(12) United States Patent
Umeda et al.

(10) Patent No.: US 9,948,274 B2
(45) Date of Patent: Apr. 17, 2018

(54) SURFACE ACOUSTIC WAVE DEVICE

(71) Applicant: Murata Manufacturing Co., Ltd., Nagaokakyo-shi, Kyoto-fu (JP)

(72) Inventors: Keiichi Umeda, Nagaokakyo (JP); Ryo Nakagawa, Nagaokakyo (JP); Atsushi Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 693 days.

(21) Appl. No.: 14/541,180

(22) Filed: Nov. 14, 2014

(65) Prior Publication Data

US 2015/0069882 A1 Mar. 12, 2015

Related U.S. Application Data

(63) Continuation of application No. PCT/JP2013/063078, filed on May 9, 2013.

(30) Foreign Application Priority Data

May 17, 2012 (JP) .................................. 2012-113171

(51) Int. Cl.
*H01L 41/047* (2006.01)
*H03H 9/02* (2006.01)
*H01L 41/16* (2006.01)

(52) U.S. Cl.
CPC ....... *H03H 9/02543* (2013.01); *H01L 41/047* (2013.01); *H01L 41/16* (2013.01); *H03H 9/0296* (2013.01); *H03H 9/02574* (2013.01)

(58) Field of Classification Search
CPC ......... H03H 9/025463; H03H 9/02574; H03H 9/0296; H01L 41/047; H01L 41/16
USPC ..... 310/313 B, 363, 346; 333/193, 150, 151, 333/155, 187; 252/62.9 R, 62.9 PZ
See application file for complete search history.

(56) References Cited

U.S. PATENT DOCUMENTS

2008/0296529 A1* 12/2008 Akiyama .............. B81B 3/0021
  252/62.9 PZ
2012/0000766 A1* 1/2012 Teshigahara ........ C23C 14/0036
  204/192.15

FOREIGN PATENT DOCUMENTS

| JP | 08-316782 A | 11/1996 |
| JP | 2004-282232 A | 10/2004 |
| JP | 2005-354650 A | 12/2005 |
| JP | 2006-270360 A | 10/2006 |
| JP | 2009-010926 A | 1/2009 |

OTHER PUBLICATIONS

Official Communication issued in International Patent Application No. PCT/JP2013/063078, dated Jul. 16, 2013.

(Continued)

*Primary Examiner* — Thomas Dougherty
*Assistant Examiner* — Karen B Addison
(74) *Attorney, Agent, or Firm* — Keating & Bennett, LLP

(57) ABSTRACT

A surface acoustic wave device includes a high acoustic velocity film in which a transversal wave propagates at a higher acoustic velocity than in a ScAlN film laminated on a substrate made of silicon or glass. The ScAlN film is laminated on the high acoustic velocity film, and IDT electrodes are laminated on the ScAlN film.

8 Claims, 5 Drawing Sheets

(56) References Cited

OTHER PUBLICATIONS

Sato et al., "High Performance Surface Acoustic Resonators in SHF Range Using ScAlN/6H-SiC Structure," Piezoelectric Material & Devices Symposium 2012, pp. 43-46.
Official Communication issued in corresponding Japanese Patent Application No. 2014-515589, dated May 19, 2015.

* cited by examiner

SURFACE ACOUSTIC WAVE DEVICE

BACKGROUND OF THE INVENTION

1. Field of the Invention

The present invention relates to surface acoustic wave devices including a scandium-containing aluminum nitride film defining a piezoelectric member.

2. Description of the Related Art

As mobile communication apparatuses have come to operate at higher frequencies in recent years, surface acoustic wave devices used in those communication apparatuses are required to operate at higher frequencies as well.

High Performance Surface Acoustic Resonators in SHF Range Using ScAlN/6H-SiC Structure (Piezoelectric Material & Devices Symposium 2012, pp. 43-46) discloses a surface acoustic wave device in which a ScAlN thin film and an interdigital transducer (IDT) electrode are formed on a SiC or diamond substrate. The ScAlN thin film is an AlN thin film in which Sc is doped. It is considered that piezoelectricity can be raised by increasing a concentration of Sc.

High Performance Surface Acoustic Resonators in SHF Range Using ScAlN/6H-SiC Structure (Piezoelectric Material & Devices Symposium 2012, pp. 43-46) discloses that, because of a ScAlN thin film being excellent in piezoelectricity, a surface acoustic wave device having a wide frequency band as well as having a high Q value can be obtained. In High Performance Surface Acoustic Resonators in SHF Range Using ScAlN/6H-SiC Structure (Piezoelectric Material & Devices Symposium 2012, pp. 43-46), in order to achieve a higher frequency operation, a high acoustic velocity substrate made of diamond or SiC is used. However, a substrate of diamond is expensive. Meanwhile, in the case where a substrate of SiC is used, the substrate need have high electric resistivity. However, a SiC substrate with high electric resistivity is hard to obtain. Even if such substrate is obtained, its price is extremely high.

SUMMARY OF THE INVENTION

Preferred embodiments of the present invention provide a surface acoustic wave device including a scandium-containing aluminum nitride film with a low price.

A surface acoustic wave device according to an aspect of various preferred embodiments of the present invention includes a substrate made of silicon or glass, a scandium-containing aluminum nitride film, a high acoustic velocity film, and an IDT electrode. The scandium-containing aluminum nitride film is provided on the substrate. The high acoustic velocity film is laminated between the substrate and the scandium-containing aluminum nitride film. An acoustic velocity of a transversal wave propagating in the high acoustic velocity film is higher than that of a transversal wave propagating in the scandium-containing aluminum nitride film. The IDT electrode is disposed on the scandium-containing aluminum nitride film.

A surface acoustic wave device according to a specific aspect of various preferred embodiments of the present invention is configured to use of a Sezawa wave as a surface acoustic wave. The Sezawa wave is a second-order mode of P+SV (shear vertical) wave.

In a surface acoustic wave device according to another specific aspect of various preferred embodiments of the present invention, the high acoustic velocity film is preferably made of aluminum nitride or boron aluminum nitride. In this case, the surface acoustic wave is more effectively confined within the scandium-containing aluminum nitride film.

A surface acoustic wave device according to still another specific aspect of various preferred embodiments of the present invention further includes a silicon oxide film laminated between the scandium-containing aluminum nitride film and the high acoustic velocity film. In this case, frequency-temperature characteristics are improved.

In a surface acoustic wave device according to yet another specific aspect of various preferred embodiments of the present invention, the substrate is preferably made of a single-crystal silicon substrate. In this case, a larger diameter design is achieved with ease, and low-profiling is achieved with ease by making the substrate thinner. In addition, because a dicing allowance is capable of being made smaller compared to a case of a piezoelectric single-crystal substrate, SiC, sapphire, or the like, the number of obtainable substrate units increases, thus making it possible to reduce costs.

According to various preferred embodiments of the present invention, because a substrate made of low-priced silicon or glass is used and a high acoustic velocity film is disposed on the substrate, it is possible to remarkably reduce the costs of a surface acoustic wave device in which a scandium-containing aluminum nitride film with an excellent piezoelectricity is used and to improve device characteristics of the surface acoustic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through description of the specific preferred embodiments thereof with reference to the drawings.

Figure 1:
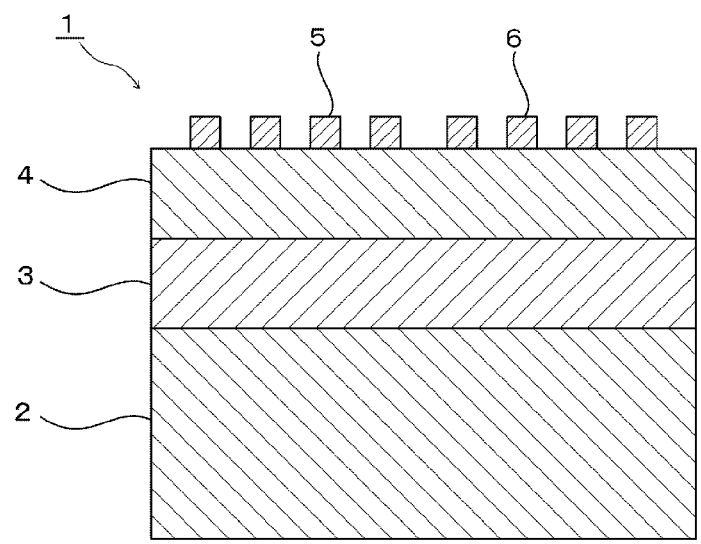
FIG. 1 is an elevation cross-sectional view schematically illustrating a surface acoustic wave device according to a first preferred embodiment of the present invention.

FIG. 1 is an elevation cross-sectional view schematically illustrating a surface acoustic wave device according to a first preferred embodiment of the present invention. A surface acoustic wave device 1 includes a substrate 2. The substrate 2 is preferably made of silicon in the present preferred embodiment. However, the substrate 2 does not have to be made of silicon (Si), but may be a substrate made of glass, for example. Silicon substrates, glass substrates, and the like are low-priced, thus making it possible to reduce the costs of the surface acoustic wave device 1.

A high acoustic velocity film 3 is laminated on the substrate 2. The high acoustic velocity film 3 is preferably made of aluminum nitride in the present preferred embodiment. A ScAlN film 4 is laminated as a scandium-containing aluminum nitride film on the high acoustic velocity film 3. The acoustic velocity of a transversal wave in the substrate made of silicon is approximately 5,900 m/sec. The acoustic velocity of a transversal wave in the high acoustic velocity film 3 made of aluminum nitride is approximately 6,300 m/sec. Meanwhile, the acoustic velocity of a transversal wave in the ScAlN film 4 is approximately 4,600 m/sec in a case of the concentration of Sc being about 40 atom % when the total of Sc and Al is taken as 100 atom %, for example.

The acoustic velocity of the transversal wave propagating in the high acoustic velocity film 3 made of aluminum nitride is higher than that of the transversal wave propagating in the ScAlN film 4. Accordingly, the surface acoustic wave propagating in the ScAlN film 4 is confined within the ScAlN film 4.

ITD electrodes 5 and 6 are provided on the ScAlN film 4. In the present preferred embodiment, providing the IDT electrodes 5 and 6 consequently configures a surface acoustic wave resonator. Of the surface acoustic waves that are excited by driving the IDT electrodes 5 and 6, a Sezawa wave is preferably used. The Sezawa wave is a second-order mode of P+SV wave.

An electrode material used to configure the IDT electrodes 5 and 6 is not limited to any specific one. For example, Al, Au, Cu, Mo, W, Pt, Sc or Ti, or an alloy mainly made of these materials can be used. Alternatively, a multilayer body of these materials may be used.

One of the unique features of the surface acoustic wave device 1 of the present preferred embodiment is that the high acoustic velocity film 3 is laminated between the substrate 2 and the ScAlN film 4. The acoustic velocity of the transversal wave propagating in the substrate 2 made of silicon is approximately the same as that of the transversal wave propagating in the ScAlN film 4. Accordingly, in the case where the ScAlN film 4 is directly laminated on the substrate 2 made of silicon, the Sezawa wave propagating in the ScAlN film 4 cannot be confined in a favorable manner.

In contrast, in the present preferred embodiment, because the high acoustic velocity film 3 is provided, the Sezawa wave is effectively confined within the ScAlN film 4. This makes it possible to remarkably reduce the costs of the surface acoustic wave device 1 in which the ScAlN film 4 having a favorable piezoelectricity is used.

Figure 2:
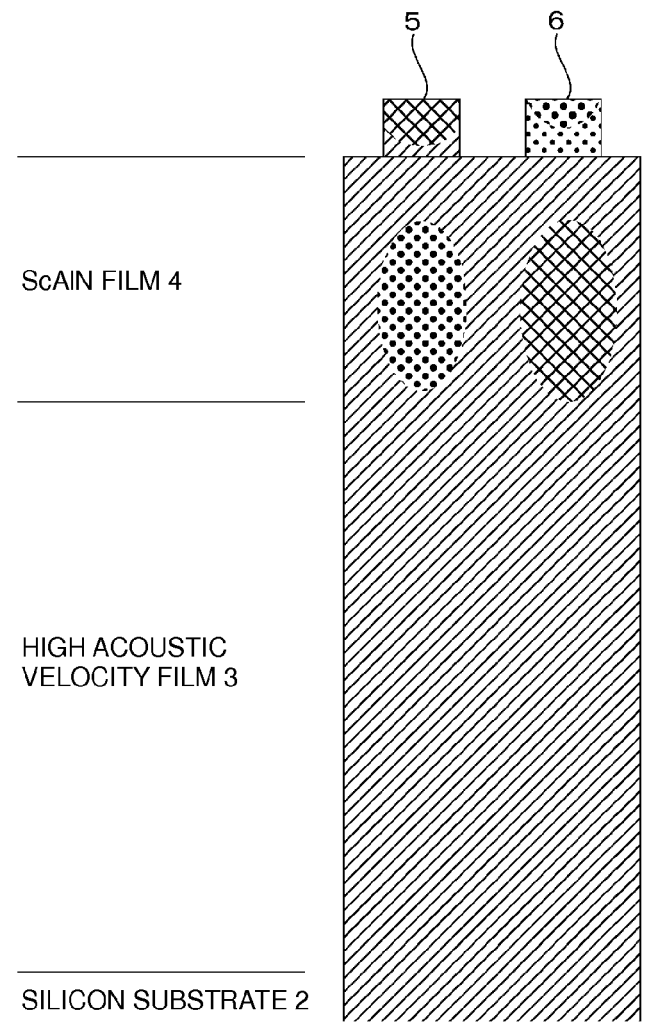
FIG. 2 is a schematic cross-sectional view illustrating displacement distribution in the surface acoustic wave device according to the first preferred embodiment of the present invention.
Figure 3:
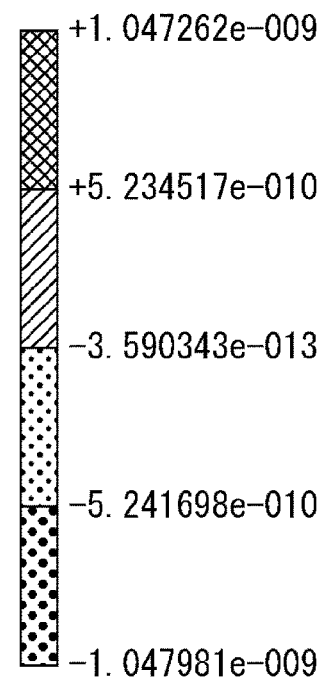
FIG. 3 is a schematic diagram indicating a contour-display scale for each hatched region in the displacement distribution shown in FIG. 2.

An aspect that the Sezawa wave is favorably confined in the surface acoustic wave device 1 will be described below with reference to FIGS. 2 and 3. FIG. 2 is a schematic cross-sectional view illustrating a z-axis directional displacement distribution in the case where resonance is taking place with the Sezawa wave in the surface acoustic wave device 1. FIG. 3 is a diagram indicating a contour-display scale for each hatched region in FIG. 2. In FIG. 3, an expression of +1.047262e−009 represents $1.047262 \times e^{-9}$.

As can be clearly understood from FIG. 2, in the case where the IDT electrodes 5 and 6 are driven and the Sezawa wave is excited, energy of the Sezawa wave is effectively confined within the ScAlN film 4. This is because the acoustic velocity of the transversal wave propagating in the high acoustic velocity film 3 is higher than that of the transversal wave propagating in the ScAlN film 4. Accordingly, the surface acoustic wave device 1 of the present preferred embodiment achieves a wider frequency band with ease at lower costs by making use of the excellent piezoelectricity of the ScAlN film 4. This will be described hereinafter with reference to FIGS. 4 and 5.

Figure 4:
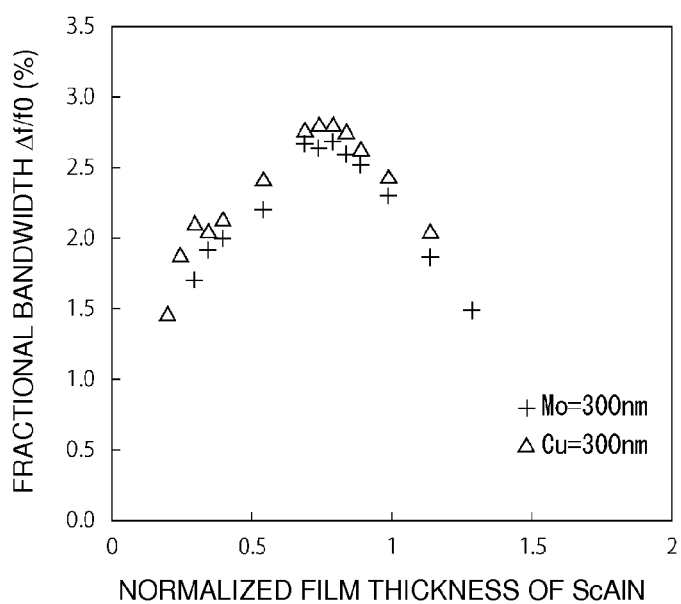
FIG. 4 is a diagram illustrating a relationship between a normalized film thickness of ScAlN and a fractional bandwidth $\Delta f/f0$ of a surface acoustic wave device in the first preferred embodiment of the present invention.

FIG. 4 is a diagram illustrating a relationship between a normalized film thickness of the ScAlN film 4 and a fractional bandwidth $\Delta f/f0$ in the surface acoustic wave device 1. The normalized film thickness of the ScAlN film is a value represented by a calculation result in which the ScAlN film thickness is divided by a wavelength determined by the IDT period. Here, the wavelength determined by the period of the IDT electrodes 5 and 6 is taken as about 2 μm, for example.

Further, the number of pairs of electrode fingers of the IDT electrodes 5 and 6 preferably is set to 160 with the intersecting width being about 80 μm, for example.

In the fractional bandwidth $\Delta f/f0$, $\Delta f$ indicates a bandwidth between a resonant frequency and an anti-resonant frequency, while f0 indicates a center frequency.

FIG. 4 illustrates the results when the IDT electrodes 5 and 6 are made of a Mo film with a thickness of about 300 nm or a Cu film with a thickness of about 300 nm, for example.

Figure 5:
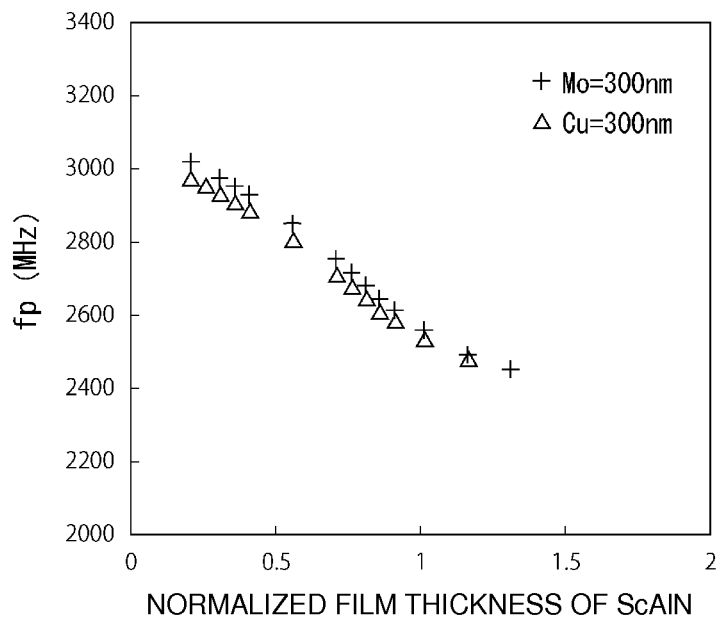
FIG. 5 is a diagram illustrating a relationship between a normalized film thickness of ScAlN and an anti-resonant frequency of a surface acoustic wave device in the first preferred embodiment of the present invention.

FIG. 5 is a diagram illustrating a relationship between the normalized film thickness of the ScAlN film and an anti-resonant frequency fp in the surface acoustic wave device 1 configured in the same manner as described above.

As can be clearly understood from FIGS. 4 and 5, the fractional bandwidth is high to be no less than about 2.5% and the anti-resonant frequency fp is also high to be no less than about 2,600 MHz when the normalized film thickness of the ScAlN film is within a range of about 0.6 to about 0.9, for example. Further, it can be understood that the same effect can be obtained in either case of using Mo or Cu for the electrode material.

It was discovered and confirmed that the resonant energy of the Sezawa wave was not confined in the ScAlN film and vibration leakage occurred in the surface acoustic wave device having the same configuration as described above but not including the high acoustic velocity film 3.

Figure 6:
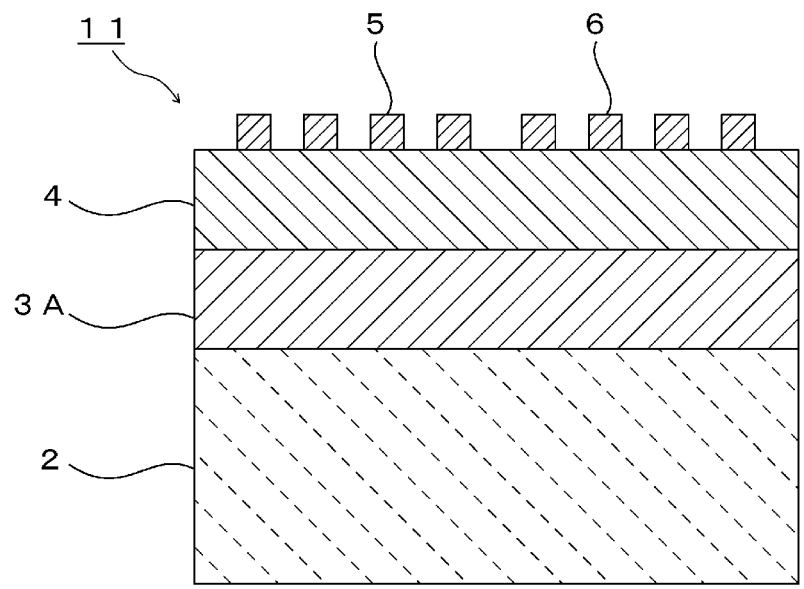
FIG. 6 is an elevation cross-sectional view schematically illustrating a surface acoustic wave device according to a second preferred embodiment of the present invention.

FIG. 6 is an elevation cross-sectional view schematically illustrating a surface acoustic wave device according to a second preferred embodiment of the present invention. In a surface acoustic wave device 11 according to the second preferred embodiment, a high acoustic velocity film 3A is preferably made of boron aluminum nitride, that is, the film 3A preferably is a BAlN film, for example. Here, the content rate of boron B is assumed to be 35 atom %. The acoustic velocity of a transversal wave propagating in the boron aluminum nitride film is approximately 6,800 m/sec, and is higher than that of the transversal wave in the aluminum nitride film. As such, according to the present preferred embodiment, the energy of the Sezawa wave is more effectively confined within the ScAlN film 4. The surface acoustic wave device 11 of the second preferred embodiment is preferably the same as the surface acoustic wave device 1 of the first preferred embodiment except that the material of the high acoustic velocity film 3A is changed as mentioned above. Accordingly, same portions as those in the first preferred embodiment are given the same reference signs and description thereof will be omitted.

Because a transversal wave propagates in the high acoustic velocity film 3A at a high acoustic velocity as mentioned above, the surface acoustic wave energy of the Sezawa wave is further confined within the ScAlN film 4 in the present preferred embodiment as well. This makes it possible to increase a Q value. Accordingly, also in the present preferred embodiment, like in the first preferred embodiment, the substrate 2 made of low-priced silicon preferably is used in the surface acoustic wave device 11 in which the ScAlN film 4 having a favorable piezoelectricity is used, such that cost reduction is achieved.

Figure 7:
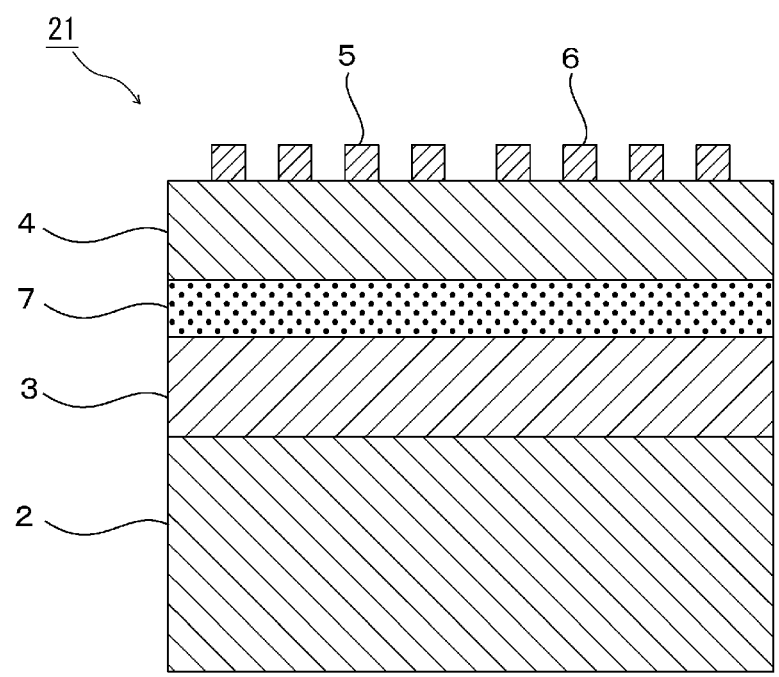
FIG. 7 is an elevation cross-sectional view schematically illustrating a surface acoustic wave device according to a third preferred embodiment of the present invention.

FIG. 7 is an elevation cross-sectional view schematically illustrating a surface acoustic wave device 21 according to a third preferred embodiment of the present invention. In the surface acoustic wave device 21, a silicon oxide film 7 is laminated between the high acoustic velocity film 3 and the ScAlN film 4. Other points are preferably the same as those in the first preferred embodiment. As such, same portions as those in the first preferred embodiment are given the same reference signs so as to make reference to the description of the first preferred embodiment.

In the present preferred embodiment, since the silicon oxide film 7 is laminated between the high acoustic velocity film 3 and the ScAlN film 4, frequency-temperature characteristics are improved. In various preferred embodiments of the present invention, as described above, it is preferable to laminate the silicon oxide film 7 so as to improve the frequency-temperature characteristics. Moreover, the frequency-temperature characteristics are capable of being improved by making a dopant such as boron, phosphorus, arsenic, aluminum, or the like be added in the silicon substrate at a high concentration of no less than about $1e^{19}/cm^3$.

The acoustic velocity of a transversal wave in the silicon oxide film 7 is approximately 3,700 m/sec. The acoustic velocity of the transversal wave in the silicon oxide film 7 is not so high; however, also in the present preferred embodiment, because the high acoustic velocity film 3 is provided, the Sezawa wave used in operation is effectively confined in an upper portion relative to the high acoustic velocity film 3 in FIG. 7. This makes it possible to increase a Q value and realize a wider frequency band like in the first preferred embodiment. In addition, by using a substrate made of low-priced silicon, cost reduction is achieved in the third preferred embodiment as well.

Although the substrate 2 is preferably made of silicon in the preferred embodiments discussed above, a glass substrate may be used instead. Also in this case, costs of the surface acoustic wave device are remarkably reduced compared to a case of using a substrate of diamond, SiC, or the like.

Further, the high acoustic velocity film is not intended to be limited to an aluminum nitride film or a boron aluminum nitride film. For example, a carbon nitride film, a diamond film, a boron nitride film, or the like may be used. However, in order to reduce the costs, it is preferable not to use a diamond film but use an aluminum nitride film, a boron aluminum nitride film, a carbon nitride film, or a boron nitride film. In addition, the aluminum nitride film or the boron aluminum nitride film has a wurtzite-type structure. The ScAlN also has a wurtzite-type structure. Accordingly, in the case where the aluminum nitride film or the boron aluminum nitride film is used, crystallinity of the ScAlN film provided on the high acoustic velocity film is effectively raised. As such, it is preferable to use the aluminum nitride film or the boron aluminum nitride film having a wurtzite-type structure.

Although resonator-type surface acoustic wave devices including a plurality of IDT electrodes 5 and 6 are described in the preferred embodiments discussed above, various preferred embodiments of the present invention can be widely applied to surface acoustic wave devices that make use of the Sezawa wave. In other words, various preferred embodiments of the present invention can be applied not only to the resonator-type surface acoustic wave devices but also to surface acoustic wave devices equipped with various types of electrode structures, such as a transversal-type surface acoustic wave device and so on.

Figure 8:
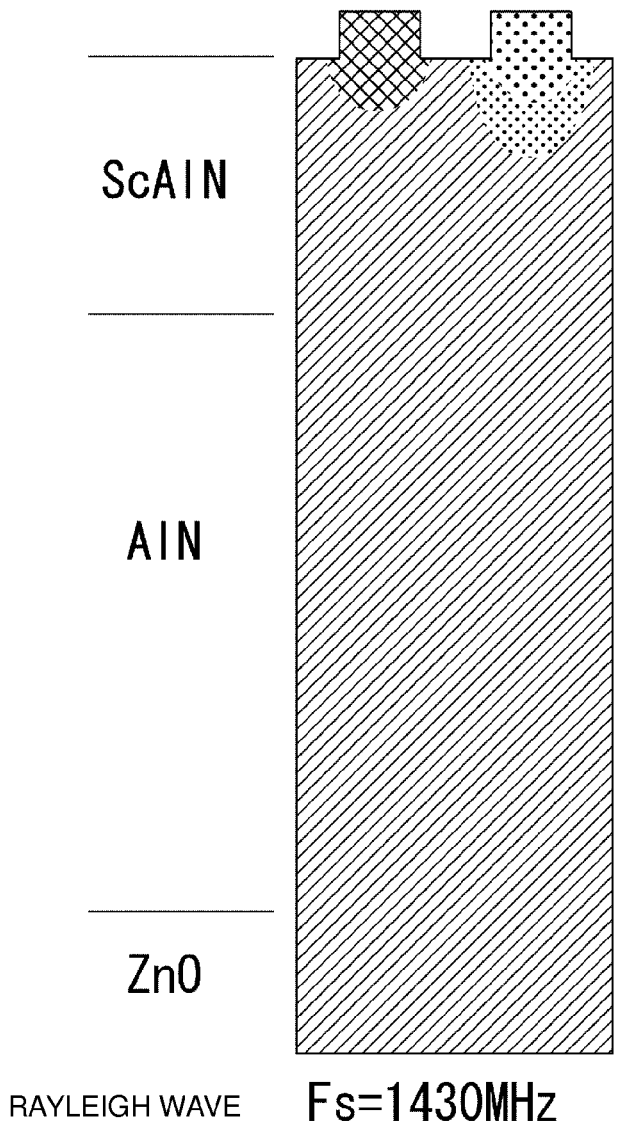
FIG. 8 is a schematic cross-sectional view illustrating displacement distribution in a case of making use of a Rayleigh wave.

FIG. 8 is a schematic cross-sectional view illustrating displacement distribution in a case of using a Rayleigh wave. Scales of hatched regions in FIG. 8 are the same as those indicated in FIG. 3. As can be clearly understood from FIG. 8, in the case of using the Rayleigh wave, which is a first-order mode of P+SV wave, the Rayleigh wave is effectively confined as well. Accordingly, the same effects are achieved as those achieved in the above-discussed preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a substrate made of silicon or glass;
   a scandium-containing aluminum nitride film provided on the substrate;
   a high acoustic velocity film configured such that a transversal wave propagates at a higher acoustic velocity than in the scandium-containing aluminum nitride film and which is laminated between the substrate and the scandium-containing aluminum nitride film; and
   an IDT electrode provided on the scandium-containing aluminum nitride film.

2. The surface acoustic wave device according to claim 1, wherein the substrate, the scandium-containing aluminum nitride film, the high acoustic velocity film, and the IDT electrode are configured such that a Sezawa wave is used as a surface acoustic wave.

3. The surface acoustic wave device according to claim 1, wherein the high acoustic velocity film is made of aluminum nitride or boron aluminum nitride.

4. The surface acoustic wave device according to claim 1, further comprising a silicon oxide film that is laminated between the scandium-containing aluminum nitride film and the high acoustic velocity film.

5. The surface acoustic wave device according to claim 1, wherein the substrate is a single-crystal silicon substrate.

6. The surface acoustic wave device according to claim 1, wherein a normalized film thickness of the scandium-containing aluminum nitride film is within a range of about 0.6 to about 0.9.

7. The surface acoustic wave device according to claim 1, wherein the substrate, the scandium-containing aluminum nitride film, the high acoustic velocity film, and the IDT electrode are configured such that a Rayleigh wave is used as a surface acoustic wave.

8. The surface acoustic wave device according to claim 1, wherein the scandium-containing aluminum nitride film is disposed directly on a surface of the high acoustic velocity film.

* * * * *